United States Patent
Sharon et al.

(10) Patent No.: US 8,910,017 B2
(45) Date of Patent: Dec. 9, 2014

(54) FLASH MEMORY WITH RANDOM PARTITION

(75) Inventors: Eran Sharon, Rishon Lezion (IL); Idan Alrod, Herzliya (IL)

(73) Assignee: SanDisk Technologies Inc., Plano, TX (US)

( * ) Notice: Subject to any disclaimer, the term of this patent is extended or adjusted under 35 U.S.C. 154(b) by 147 days.

(21) Appl. No.: 13/539,969

(22) Filed: Jul. 2, 2012

(65) Prior Publication Data

US 2014/0006898 A1    Jan. 2, 2014

(51) Int. Cl.
*G11C 29/00* (2006.01)
*G06F 11/10* (2006.01)
*H03M 13/35* (2006.01)

(52) U.S. Cl.
CPC ........... *G06F 11/1072* (2013.01); *H03M 13/35* (2013.01)
USPC ....................................... 714/763

(58) Field of Classification Search
CPC . G06F 11/1072; G06F 12/0238; H03M 13/25
USPC ................... 714/746, 755, 763, 769
See application file for complete search history.

(56) References Cited

U.S. PATENT DOCUMENTS

| | | |
|---|---|---|
| 4,785,452 A | 11/1988 | Petz et al. |
| 5,164,944 A | 11/1992 | Benton et al. |
| 5,222,109 A | 6/1993 | Pricer |
| 5,228,046 A | 7/1993 | Blake et al. |
| 5,297,148 A | 3/1994 | Harari et al. |
| 5,388,083 A | 2/1995 | Assar et al. |
| 5,438,573 A | 8/1995 | Mangan et al. |
| 5,568,439 A | 10/1996 | Harari |
| 5,598,370 A | 1/1997 | Niijima et al. |
| 5,603,001 A | 2/1997 | Sukegawa et al. |
| 5,666,371 A | 9/1997 | Purdham |
| 5,742,934 A | 4/1998 | Shinohara |

(Continued)

FOREIGN PATENT DOCUMENTS

| EP | 0 706 128 A1 | 10/1996 |
|---|---|---|
| JP | 62-283496 | 12/1987 |

(Continued)

OTHER PUBLICATIONS

English translation of Office Action dated May 13, 2009, issued in Japanese application No. 2003-368139.

(Continued)

*Primary Examiner* — Shelly A Chase
(74) *Attorney, Agent, or Firm* — Brinks Gilson & Lione

(57) ABSTRACT

A system and method for partitioning data in long term memory of a flash memory device is disclosed. The method may include the steps of identifying a type of data that has been received and routing the data to one of at least two partitions in the long term memory array. One partition of the flash memory device may be optimized for random data while another is optimized for sequential data. The method includes identifying the type of data and routing the data to the appropriate partition. Data may be analyzed and routed upon receipt or initially stored in a default partition and later analyzed and routed to another partition. The partition for random data may be configured for storing data using a first level of ECC protection while the second may be configured for storing data using a second, stronger level of ECC protection.

29 Claims, 6 Drawing Sheets

(56) References Cited

U.S. PATENT DOCUMENTS

| | | |
|---|---|---|
| 5,754,565 A | 5/1998 | Mo et al. |
| 5,835,935 A | 11/1998 | Estakhri et al. |
| 5,845,313 A | 12/1998 | Estakhri et al. |
| 5,860,082 A | 1/1999 | Smith et al. |
| 5,896,404 A | 4/1999 | Kellogg et al. |
| 5,907,856 A | 5/1999 | Estakhri et al. |
| 5,924,113 A | 7/1999 | Estakhri et al. |
| 5,956,743 A | 9/1999 | Bruce et al. |
| 5,961,660 A | 10/1999 | Capps, Jr. et al. |
| 6,000,006 A | 12/1999 | Bruce et al. |
| 6,016,275 A | 1/2000 | Han |
| 6,041,001 A | 3/2000 | Estakhri |
| 6,081,447 A | 6/2000 | Lofgren et al. |
| 6,085,339 A | 7/2000 | Jeddeloh |
| 6,115,785 A | 9/2000 | Estakhri et al. |
| 6,125,435 A | 9/2000 | Estakhri et al. |
| 6,182,239 B1 | 1/2001 | Kramer |
| 6,185,134 B1 | 2/2001 | Tanaka |
| 6,230,233 B1 | 5/2001 | Lofgren et al. |
| 6,256,762 B1 | 7/2001 | Beppu |
| 6,260,156 B1 | 7/2001 | Garvin et al. |
| 6,311,290 B1 | 10/2001 | Hasbun et al. |
| 6,353,910 B1 | 3/2002 | Carnevale et al. |
| 6,426,893 B1 | 7/2002 | Conley et al. |
| 6,487,685 B1 | 11/2002 | Stuart Fiske et al. |
| 6,510,537 B1 | 1/2003 | Lee |
| 6,651,212 B1 | 11/2003 | Katayama et al. |
| 6,662,333 B1 | 12/2003 | Zhang et al. |
| 6,747,827 B1 | 6/2004 | Bassett et al. |
| 6,769,087 B2 | 7/2004 | Moro et al. |
| 6,834,331 B1 | 12/2004 | Liu |
| 6,961,890 B2 | 11/2005 | Smith |
| 6,970,890 B1 | 11/2005 | Bruce et al. |
| 7,062,616 B2 | 6/2006 | Sadhasivan et al. |
| 7,409,623 B2 * | 8/2008 | Baker et al. ............ 714/763 |
| 7,593,263 B2 | 9/2009 | Sokolov et al. |
| 7,710,777 B1 | 5/2010 | Montierth et al. |
| 7,746,686 B2 | 6/2010 | Katti |
| 2001/0029564 A1 | 10/2001 | Estakhri et al. |
| 2001/0042230 A1 | 11/2001 | Williams et al. |
| 2002/0008928 A1 | 1/2002 | Takahashi |
| 2002/0032891 A1 | 3/2002 | Yada et al. |
| 2003/0041210 A1 | 2/2003 | Keays |
| 2003/0099140 A1 | 5/2003 | Payne et al. |
| 2003/0156473 A1 | 8/2003 | Sinclair et al. |
| 2004/0083333 A1 | 4/2004 | Chang et al. |
| 2004/0083334 A1 | 4/2004 | Chang et al. |
| 2004/0228197 A1 | 11/2004 | Mokhlesi |
| 2009/0113115 A1 | 4/2009 | Nazarian et al. |
| 2009/0222639 A1 | 9/2009 | Hyvonen et al. |
| 2010/0082537 A1 | 4/2010 | Lasser |
| 2012/0137152 A1 | 5/2012 | Dror et al. |
| 2012/0311408 A1 * | 12/2012 | Nakanishi et al. ............ 714/773 |

FOREIGN PATENT DOCUMENTS

| | | |
|---|---|---|
| JP | 62-283497 | 12/1987 |
| JP | 06-187248 A | 7/1994 |
| JP | 10-207726 | 8/1998 |
| JP | 11-073797 A | 3/1999 |
| JP | 11-283396 | 10/1999 |
| JP | 2000-020252 A | 1/2000 |
| JP | 2000-090691 | 3/2000 |
| JP | 2000-173289 | 6/2000 |
| JP | 2002-091831 A | 3/2002 |
| WO | 01/22232 A1 | 3/2001 |

OTHER PUBLICATIONS

Kim, Jesung et al., A Space-Efficient Flash Translation Layer for Compactflash Systems, IEEE Transactions on Consumer Electronics, vol. 48, No. 2, May 2002.

* cited by examiner

FLASH MEMORY WITH RANDOM PARTITION

BACKGROUND

Non-volatile memory systems, such as flash memory, have been widely adopted for use in consumer products. Flash memory is used in numerous applications including mobile phones, digital cameras, MP3 players and many other applications. Flash memory may be found in different forms, for example in the form of a portable memory card that can be carried between host devices or as a solid state disk (SSD). In order to be cost efficient, it is desirable to implement SSD memories using high density Multi-Level Cell (MLC) flash memories rather than Single-Level Cell (SLC) flash memory which has 1-bit per cell storage capacity. Using MLC technology, the memory capacity can be increased by a factor of 3 (for MLC storing 3 bits in each cell) or even by a factor of 4 (for memories storing 4 bits in each cell) as compared to SLC flash without increasing the physical dimensions of the memory. What increases in MLC flash is the amount of data stored in each memory cell and in each physical page (Word Line (WL)) of the memory.

Sophisticated and modern error correction codes (ECC) are typically implemented in order to guarantee that the data can be read from flash memory without errors, particularly in MLC flash memory. The error correction coding scheme used to protect the user data, and the mapping of the code words into the pages of the WL, directly affect the reliability of the data and the efficiency of accessing it (i.e. the programming and reading speed). Unfortunately, the requirements for reliability and fast access are usually contradicting. For example, long code words typically provide better error correction and a lower error floor, which in turn provide higher reliability and better cycling and data retention specification. On the other hand, using long code words implies longer transfer and decoding times, incurring potentially unacceptable latencies, especially if very small data chunks (e.g. a 0.5 KB sector) are used. Also, as a function of the mapping from bits to states, the different pages of a WL potentially exhibit different reliabilities (i.e. different error rates).

SUMMARY

In order to address the problem of balancing the desire for reliable and strong error code correction with the need for high performance in long term memory of a memory device, a method and system are provided for partitioning a long term memory space into regions that support different levels of ECC protection and directing data to a particular partition based on certain criteria regarding the data.

According to a first aspect of the invention, a method is disclosed for a flash memory device in which, in a controller of the flash memory device, the controller receives data from a host and determines a data type for the received data. If the data type for the received data is determined to be a first data type, the controller applies a first level of error correction code (ECC) protection to the received data and stores the received data having the first level of ECC protection in a first partition of the flash memory. If the data type for the received data is determined to be a second data type, the controller applies a second level of ECC protection to the received data and stores the received data encoded with the second level of ECC protection in a second partition of the flash memory. The first data type may be data optimized for random access and the second data type may be data optimized for sequential access.

In another aspect of the invention, a memory device includes a memory having a long term memory array with at least a first partition and a second partition, where each of the first partition and second partition is configured for data encoded with a different level of error correction code (ECC) protection. A controller is in communication with the memory, and is configured to receive data from a host and determine a data type for the received data. The controller is further configured to, when the data type of the received data is determined to correspond to a first data type, encode the received data with a first level of ECC protection and store the data encoded with the first level of ECC protection in the first partition. The controller is also configured to, when the data type of the received data is determined to correspond to a second data type, encode the received data with a second level of ECC protection and store the data encoded with the second level of ECC protection in the second partition. The long term memory array may comprise flash memory, such as multi-level cell (MLC) flash memory. The first data type may be random access data and the second data type may be sequential access data. The first level of ECC protection may be less than the second level of ECC protection. For example, the first level may include a non-interleaved ECC scheme while the second level of ECC protection may include an interleaved ECC scheme. The first level may include a higher rate code than the second level.

In other aspects of the invention, the method may include determining the data type and routing the received data directly to a desired partition in long term memory upon receipt. Alternatively, the method may include applying a first level of ECC protection to received data and storing the data in a default partition until a later triggering event occurs, such as a garbage collection operation or any other type of memory management operation, and then analyzing a data type of the data in the first partition to determine if the data type is best stored in the default partition or a second partition. Data moved from the default partition to a second partition based on later determined data type may be read from the default partition and written to the second partition with a new level (potentially higher level) of ECC protection applied corresponding to that of the second partition. A memory device having at least two partitions in the higher density portion of the long term memory configured for random and sequential data, and a controller configured to store received data in a default partition and later assess the appropriate partition in response to a trigger event, is also disclosed.

BRIEF DESCRIPTION OF THE PRESENTLY PREFERRED EMBODIMENTS

Figure 1:
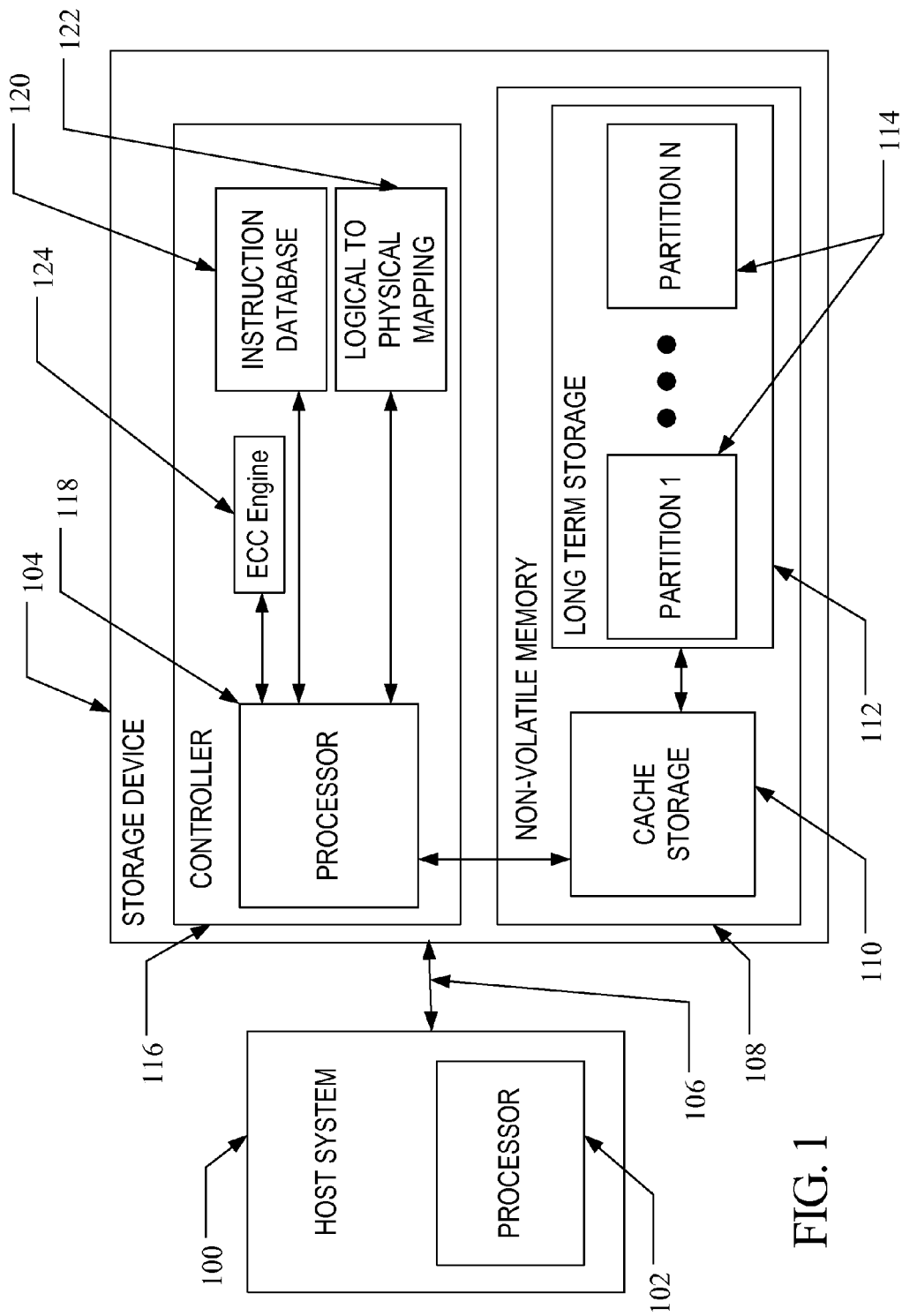
FIG. 1 is a block diagram of a self-caching memory system having a long term memory with partitions for different data access needs.

The storage format of data can affect the reliability of the data and the responsiveness of a host device, such as a general purpose computer or a mobile phone. General purpose computers typically support a variety of data types and a requirement for faster read and write times. Some files may be distributed across a random set of addresses, and the amount of data per read required by a host may be much smaller than the WL size. Modern mobile phones are often connected to the Internet and allow for surfing and communicating via a network. To increase performance of the Internet connection, some applications learn the user's habits and "push" data into the device during idle times. When the user wants to access the Internet in search for new data, the mobile phone will first use the data which was already "pushed" to the local device, and only if there is no matching data on the user's local phone, or if the local copy of the required data is corrupt or not updated, the Internet will be searched. This type of data may be characterized by two properties: the "pushed" data is intended for storage in the local storage device for a short period of time; and the data may typically be reconstructed from data available on the network.

These characteristics of the data imply that the data does not need to be encoded with very powerful error correction codes. Shorter codes with less redundancy, higher data rate, higher error floor, and faster read/write times may be advantageous for storage of this type of data. Similarly, in addition to data that is pushed from the Internet or can be reconstructed/downloaded easily, other data types may need less ECC protection and faster access. For example, files used by an operating system and that may be read frequently. Also, data for files where only a small sector of the file is being read and updated at a given time can take extra time to store or retrieve. After reading and updating a small sector of such a file, the updated sector may be stored in a different location than its original address (e.g. if the updated sector is larger than the original, and does not fit into the original location). Such files tend to be written across many locations, and are referred to as files requiring random access. All of the data types described above (e.g., pushed data, temporary data, operating system data and random access data) are initially referred to herein as random data.

In contrast, other data types, such as files containing digital photos, music, user files and etc. are usually stored sequentially, and are read and written in sequential order. These file types are typically better stored with strong error correction code protection and are initially referred to herein as sequential data. Because of the differing needs of the different types of data for speed of access and ECC protection, a flash memory system which supports at least two storage formats simultaneously, other than in the SLC cache, and a method for operating such a system is disclosed herein.

A flash memory system suitable for use in implementing aspects of the invention is shown in FIG. 1. A host system 100 having a processor 102 stores data into, and retrieves data from, a self-caching flash storage device 104. The storage device 104 may be a solid state disk (SSD) embedded in the host, flash memory in a mobile phone or may exist in the form of a card or other removable drive that is removably connected to the host 100 through a mechanical and electrical connector. The host 100 may be any of a number of data generating devices, such as a personal computer, portable tablet or computing device, mobile phone or etc. The host 100 communicates with the storage device over a communication channel 106.

The storage device 104 contains non-volatile memory 108 that includes cells that are arranged as a short term storage array (referred to herein as cache storage) 110 and a long term storage array 112. The cache storage 110 and long term storage 112 may be made up of the same type of flash memory cell or different types of flash memory cells. For example, the cache storage 110 may be configured in a single level cell (SLC) type of flash configuration having a one bit per cell capacity while the long term storage 112 may consist of a multi-level cell (MLC) type flash memory configuration having two or more bit per cell capacity to take advantage of the higher write speed of SLC flash and the higher density of MLC flash. Different combinations of flash memory types are also contemplated for the cache storage 110 and long term storage 112. The long term storage includes at least two partitions 114, where each partition is optimized for a different class of data as discussed in greater detail below. The storage device 104 also includes a controller 116 that may include a processor 118, instructions 120 for operating the processor 118 and a logical block to physical block address translation table 122.

Figure 2:
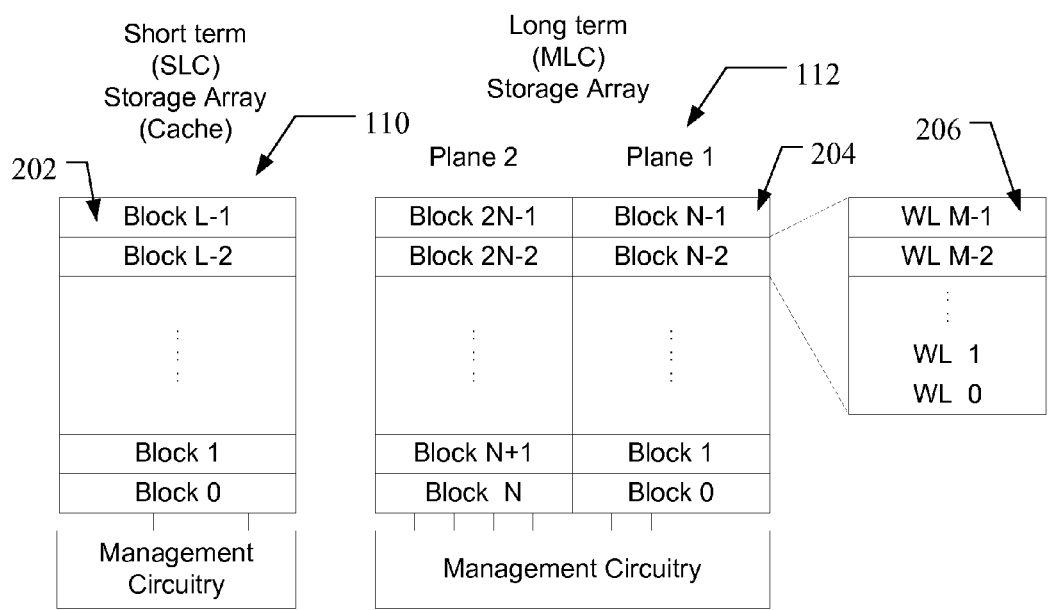
FIG. 2 illustrates an example physical memory organization of the system of FIG. 1.

Referring to FIG. 2, the cache storage 110 is typically implemented as an array of SLC blocks 202, while the long term memory 112 is implemented as an array of MLC blocks 204. Each block is comprised of Word Lines (WL) 206 and a group of cells belonging to same WL 206 is denoted as a physical page. A block of memory cells is the unit of erase, i.e., the smallest number of memory cells that are physically erasable together. For increased parallelism, however, the blocks may be operated in larger metablock units. One block from each plane of memory cells may be logically linked together to form a metablock. In a storage device where the cache storage 110 is in an SLC configuration and the main storage 112 is in an MLC configuration, a metablock arrangement is useful because multiple cache blocks 202 may be needed to store an amount of data equal to one main storage block 204. Each block in the SLC storage is also composed of cells. The number of bits in each cell is different between the SLC and MLC storage areas. The number of logical pages in each WL corresponds to the number of bits stored in each cell. Therefore in one physical page in the SLC storage there is also one logical page while the number of logical pages stored in the MLC storage could be 3 for the case where the MLC storage includes 3 bits in each cell.

Figure 3:
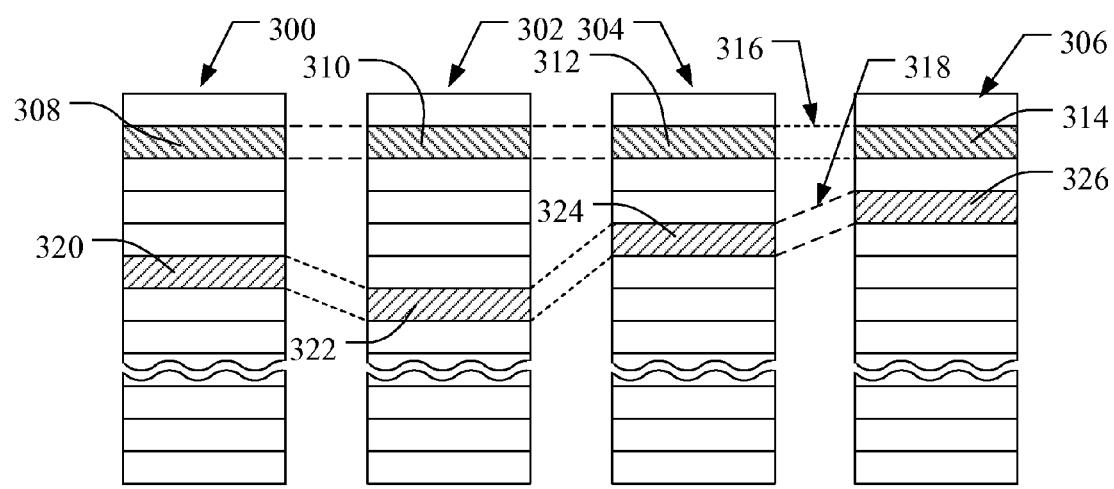
FIG. 3 illustrates an alternative example physical memory organization.

Referring to FIG. 3, a conceptual illustration of a representative flash memory cell array is shown having metapages and metablocks. In the example of FIG. 3, four planes or sub-arrays 300, 302, 304 and 306 memory cells are shown that may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 3 by rectangles, such as blocks 308, 310, 312 and 314, located in respective planes 300, 302, 304 and 306. There may be dozens or hundreds or thousands of blocks in each plane. Blocks may be logically linked together to form a metablock that may be erased as a single unit. For example, blocks 308, 310, 312 and 314 may form a first metablock 316. The blocks used to form a metablock need not be restricted to the same relative locations within their respective planes, as is shown in the second metablock 318 made up of blocks 320, 322, 324 and 326.

Figure 4:
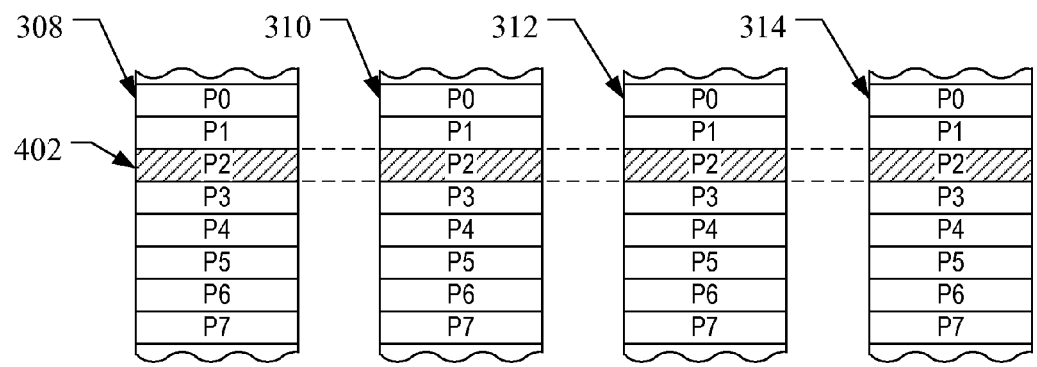
FIG. 4 shows an expanded view of a portion of the physical memory of FIG. 3.

The individual blocks are in turn divided for operational purposes into pages of memory cells, as illustrated in FIG. 4. The memory cells of each of blocks 308, 310, 312 and 314, for example, are each divided into eight pages P0-P7. Alternately, there may be 16, 32 or more pages of memory cells within each block. A page is the unit of data programming and reading within a block, containing the minimum amount of data that are programmed or read at one time. A metapage 402 is illustrated in FIG. 3 as formed of one physical page for each of the four blocks 308, 310, 312 and 314. The metapage 402 includes the page P2 in each of the four blocks but the pages of a metapage need not necessarily have the same offset position within each of the blocks. A metapage is the maximum unit of programming. The blocks disclosed in FIGS. 2-4 are referred to herein as physical blocks because they relate to groups of physical memory cells as discussed above. As used herein, a logical block is a virtual unit of address space. Each logical block typically defines a logical block address (LBA) that is associated with data received from a host 100. The LBAs are then mapped to one or more physical blocks in the storage device 104 where the data is physically stored.

In operation, the error correction coding (ECC) scheme used by the storage device 104 to protect the user data, and the mapping of the code words into the pages of the WL, directly affect the reliability of the data and the efficiency of accessing it (e.g. the programming and reading speed). The word lines of MLC flash memories are considered as made of multiple logical pages, where each logical page contains the bits in a certain position. For example, in 3 bit per cell MLC flash, there will be 3 logical pages: one for the least significant bit (LSB), one for the most significant bit (MSB) and a third for the middle bit. They are also sometimes referred to as upper, middle and lower pages.

In many flash memory implementations, the ECC code words are programmed and read per logical page. This means that each code word is written in a unique logical page. This mode of operation achieves fast read and write times, but it may suffer from a larger amount of errors where the errors in each logical page have a different probability. This follows from the fact that the different logical pages have different error distributions, and the total error resiliency of the memory device is governed by the least reliable page. In other flash memory implementations, the ECC code words are programmed in an interleaved fashion, where each code word is programmed across multiple logical pages of a Word Line. The errors in this mode of operation (interleaved code words) are balanced across all the pages of the WL. In addition, the code words used in this mode of operation are typically longer than the code words used in a non-interleaving mode. It is known that long error correction codes can provide better error correction capability and a lower error floor, which in turn provide higher reliability and better cycling and data retention specification. On the other hand, using long code words implies slower transfer and decoding times, incurring unacceptable latencies, especially if very small data chunks (e.g. 0.5 KB sectors) are needed. Furthermore in the interleaved case the sensing time is longer than in the non-interleaved case because, in the interleaved case, for each ECC block read all the voltage thresholds need to be read, while in the non-interleaved case only the voltage thresholds corresponding to the required logical page are being sensed.

As a function of the mapping from bits to states, the different pages of a WL exhibit different reliabilities (e.g. different error rates). Therefore it may be desired to span the ECC code word evenly over all the pages in a WL, such that the different error rates are balanced and equal reliability is obtained over all the data. However, spanning the code word evenly over all the pages implies that all the pages will need to be read in order to recover the data and this may slow down the reading time.

Figure 5:
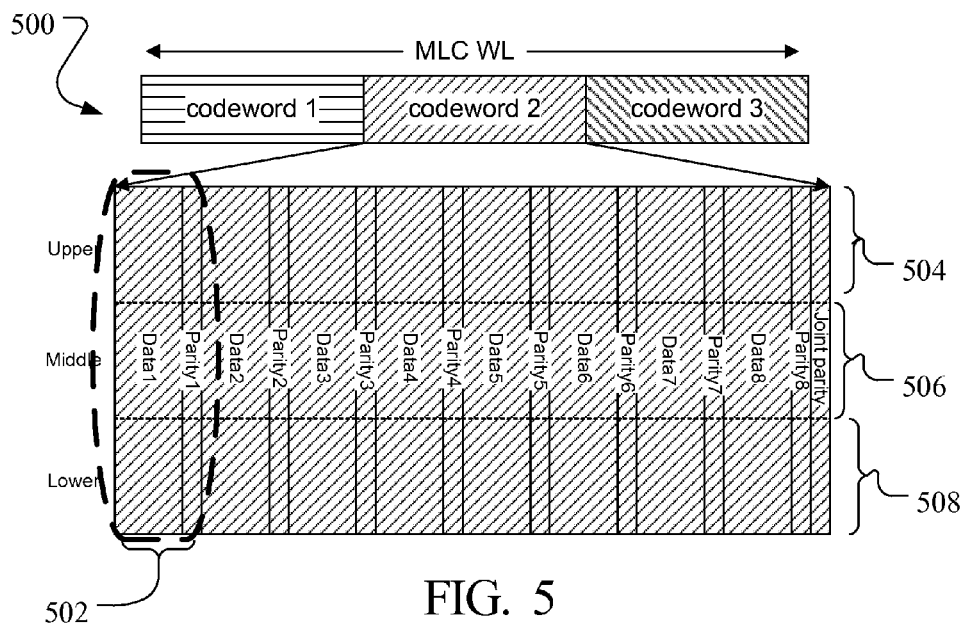
FIG. 5 illustrates a multi-level cell wordline where data on upper, middle and lower pages has error correction coding applied in an interleaved manner.
Figure 6:
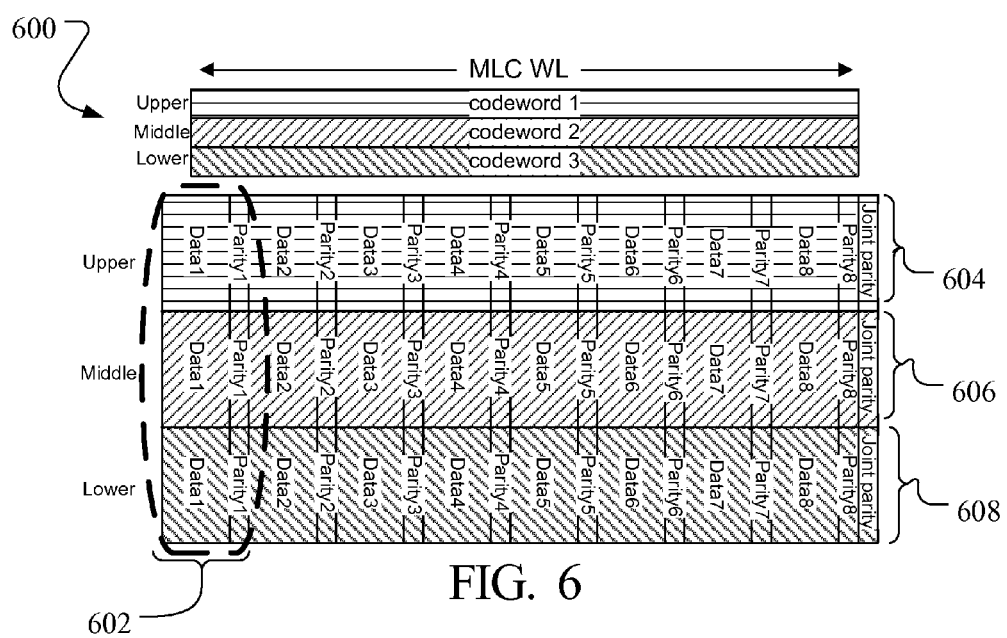
FIG. 6 illustrates a multi-level cell wordline where data on upper, middle and lower pages has error correction coding applied in a non-interleaved manner.

An ECC code word which is spread along multiple pages is called an interleaved code word, while code words which are stored in one logical page are called non-interleaved. An example of an interleaved ECC scheme in a WL 500 of a 3 bit-per-cell MLC memory is shown in FIG. 5, where each code word (e.g. "codeword 2") is interleaved among all the different pages (upper 504, middle 506 and lower 508) of the WL 500. Typically in the interleaved ECC scheme, each cell of the WL 500 includes information related to one sub-code word 502. The entire code word consists of 8 sub-code words in the example of FIG. 5, each sub-word including a data portion and a parity portion, where each sub-code word may include thousands of bits such that each sub-code word will be stored in as many 3 bit-per-cell MLC memory cells as is necessary to accommodate the number of bits in the sub-code word. An example of a non-interleaved ECC scheme is shown in FIG. 6, where each code word is only spread across one page (upper 604, middle 606 or lower 608) of each cell of the WL 600. In the non-interleaved example of FIG. 6, each of the 3 bit-per-cell MLC memory cells include parts of three different code words, such that item 602 represents 3 sub-code words.

Files which are read with low frequency by the user, or files which are stored and read in a sequential order (e.g. music file, photos, movies), may be better stored in an interleaved ECC mode while frequently used files, especially files related to the operating system (of a host such as a PC, cell phone, tablet) and files that are used often by the user (or the host), may be best stored in non-interleaved ECC mode. Similarly, it may be advantageous to manage randomly accessed or stored data using one type of ECC scheme, while managing sequentially stored data using another type of ECC scheme.

Figure 7:
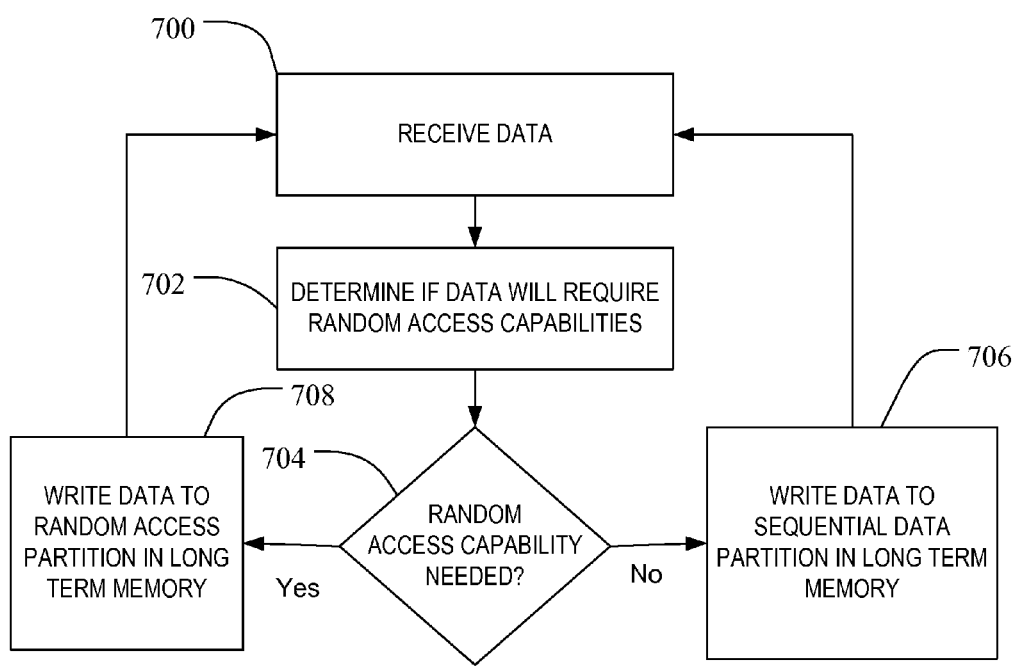
FIG. 7 is a flow chart of an embodiment of a method for segregating received data into partitions optimized for different data access needs.

As is discussed in more detail below, in order to achieve a balanced mix of memory performance and ECC protection for different types of data, a system and method of utilizing a partitioned long term storage array to handle different data types disclosed herein allows data to be divided into appropriate partitions optimized for random or sequential data. Utilizing the storage device 104 of FIG. 1, which includes at least two partitions 114 in its long term storage array 112, FIG. 7 illustrates an embodiment of a process for dividing data into appropriate partitions 114. The partitions 114, shown as a plurality of partitions (Partition 1 . . . Partition N) in FIG. 1 may be physical partitions in the long term storage array 112. The partitions 114 may each comprise one or more planes of the long term storage array 112. In large memory systems having multiple memory dies that make up the long term storage array 112, the partitions may be associated with different physical die. In yet other implementations, the partitions 114 may be separate planes of a single die or even separate portions of the same plane. In the examples below, two partitions are discussed, however more than two partitions, each optimized for a different type or types of data, may also be implemented. In one embodiment, files or other data requiring random access will be written to a partition configured as a random access partition, while data not requiring random access (such as sequential data) will be written to a different partition in the long term storage array 112.

Referring to FIG. 7, when data is received (at 700) a determination is made as to what type of data has been received. In particular, a determination is made as to whether the received data is considered data needing random access capabilities (at 702). If the received data is determined to need random access capabilities, it is written to the partition 114 in the long term memory array 112 optimized for random access (at 704, 708). If the received data is determined to be sequential data or another type of data which does not need random access capability, it is written to the sequential access partition in the long term memory array 112 (at 704, 706).

In the example of FIG. 7, the first partition is configured to store random access data with a first level of ECC protection, and the second partition is configured to store sequential data or other non-random access data using a second level of ECC protection. The first level of ECC protection is preferably a lower level of ECC protection than the second level of ECC protection. For example, the first level may be a non-interleaved ECC scheme such as illustrated in FIG. 6 and the second level of ECC protection may be an interleaved ECC scheme such as illustrated in FIG. 5. The lower level ECC protection may be set for data designated to be kept in NVM (Non Volatile Memory) for a short period because the effect of data retention (D/R) voltage drift over a short period of time is less likely to cause errors compared with the longer term NVM storage where the effect of voltage drift over a longer time may be more likely to cause errors. Another reason for placing a lower ECC level on a partition in long term memory designated for data designated to be stored for a shorter period of time is that, for that type of data, there is often a backup in the network or cloud, such that if the ECC fails it is possible to retrieve an uncorrupted version of the data from the network or cloud. Even though such retrieval may incur a larger delay, the probability of such an ECC failure event should be rare enough that the user experience should not be affected. Also, because most of the data access on the lower level ECC protection partition should be faster, the overall user experience is improved while maintaining data reliability.

Various alternatives for the first and second ECC level associated with the first and second partitions are also contemplated. In one implementation, the same ECC algorithm may be used in combination with the differing interleave schemes. Alternatively, both the interleaving scheme and the ECC algorithm may differ between the first partition and the second partition. The same interleaving scheme, but different ECC algorithms may be used in the first and second partitions, or the same ECC algorithm, but different code word lengths may be used in yet other alternatives. In yet another embodiment, the number of parity bits differs between the first and second partition with or without combining it with different information length or interleaved/non-interleaved schemes. In other embodiments, the levels of ECC protection may differ between partitions based on differing error floors. An error floor is an attribute of iterated sparse graph-based error correcting codes like low-density parity-check (LDPC) codes and turbo codes. When the bit error ratio (BER) is plotted for LDPC codes and turbo codes there is a point after which the input BER is reduced but the output block error rate (BLER) curve does not fall as quickly as before, so that there is a region in which correction capability almost flattens. This region is called the error floor region. Error floors may be attributed to low-weight code words, trapping sets or near-code words.

As noted above, the differences between the two or more partitions 114 in the long term memory array 112 may include differences in one or more of the following: storing the data in interleaved or non-interleaved form, the number of redundancy bits used by the ECC, the length of the code words (keeping the same code rate), the ECC algorithm (for example one partition may encode with a BCH code, while another will use an LDPC code), the error floor of the code, the decoding method (one partition may use Full Power decoding while another partition may use Low Power decoding). Although it is contemplated that the resolution of the cells in each partition of the long term memory array will be the same in one embodiment, in some other embodiments the number of bits per cell may also vary from one partition to another. A code rate is the ratio between the amount of information bits and the total amount of bits (information plus parity). Regardless of the particular combination of ECC attributes used in the two partitions, embodiment of random and sequential partitions discussed herein, the random data partition is configured with a combination of attributes that preferably provides a lower level of ECC protection (and is thus less resource consuming) than the higher level of ECC protection provided in the combination of attributes utilized in the partition optimized for sequential data. In other embodiments utilizing more than two partitions, each partition may be configured with a different level of ECC protection. In one embodiment, a partition configured for random access data (or frequently accessed data) may include a shorter code word, a higher code rate and use a non-interleaved code word storage format. A partition configured for sequential (or less frequently accessed) data may then include a longer code word and lower code rate than the random partition, as well as use an interleaved code word storage format.

Determining that the received data requires random access may be done either by an explicit request by the host, or by estimation done at the memory array level. Other options for determining include determining the data type using the controller 116 (FIG. 1) which is attached to the non-volatile memory array 108 and has better computation capabilities. For example, the method illustrated in FIG. 7 may be implemented with the processor 118 of the controller 116 in the storage device 104 based on firmware or other instructions stored in the controller instruction database 120 which may be in controller volatile memory (assumed to be within the processor 118 in FIG. 1 for simplicity of the figure even though in practical cases such memory is usually placed outside the processor 118 within the controller 116) or in the non-volatile memory 108. The instruction database 120 may include the ECC protection level instructions, the ECC algorithms, ECC code words of different lengths and other attributes. In this embodiment, data received from the host system 100 may be marked with information that the controller 116 can use to determine if the data is random access data or not and accordingly activate the ECC engine 124. Alternatively, or in combination, the controller 116 may deduce the category (e.g., random access or sequential) of data from past pattern of usage information, such as the file the data is associated with, the frequency of usage, the reading method (random or sequential), etc.

The criteria for determining whether data needs random access capabilities may include the type of the file (e.g. according to the file name suffix), or the folder in which the file resides (e.g. a temporary folder, or an operating system folder), or the addressing method used for writing the file, whether it is random or sequential. Criteria related to file location and addressing may be derived as a request from the host system 100. In some embodiments, the controller 116 of the storage device 104 may be configured to determine a desired partition 114 using enhanced file-tagging information from a host 100. For example information may be received in any of a number of formats, such as Embedded MultiMediaCard (eMMC) electrical standard version 4.5 published as Standard No. JESD84-B45 by JEDEC Solid State Technology Association of Arlington, Va., which supports a command protocol that includes a data tag feature where the host 100 can mark certain data transactions to direct data to a memory region or indicate a priority level for the data.

Other options for determining that a file requires random access capabilities may be done according to the history of writes and reads of the file, or by the code rate (the ratio between information data to code word length) associated with the file. For example, if data associated with a certain file is encoded with a high code rate (e.g. greater than 0.95) this may indicate that the file should be stored in the random partition because only a small number of redundant bits are added to the information bits. On the other hand, if the code rate associated with a file is 0.5 (i.e., one parity bit was added for each information bit) this may indicate that the file should be stored in the sequential partition. Similarly, if a file is read with a high frequency, (e.g. once every several minutes), this may indicate that the file should be stored in a different partition than a file which is rarely read, (e.g. once a month).

Figure 8:
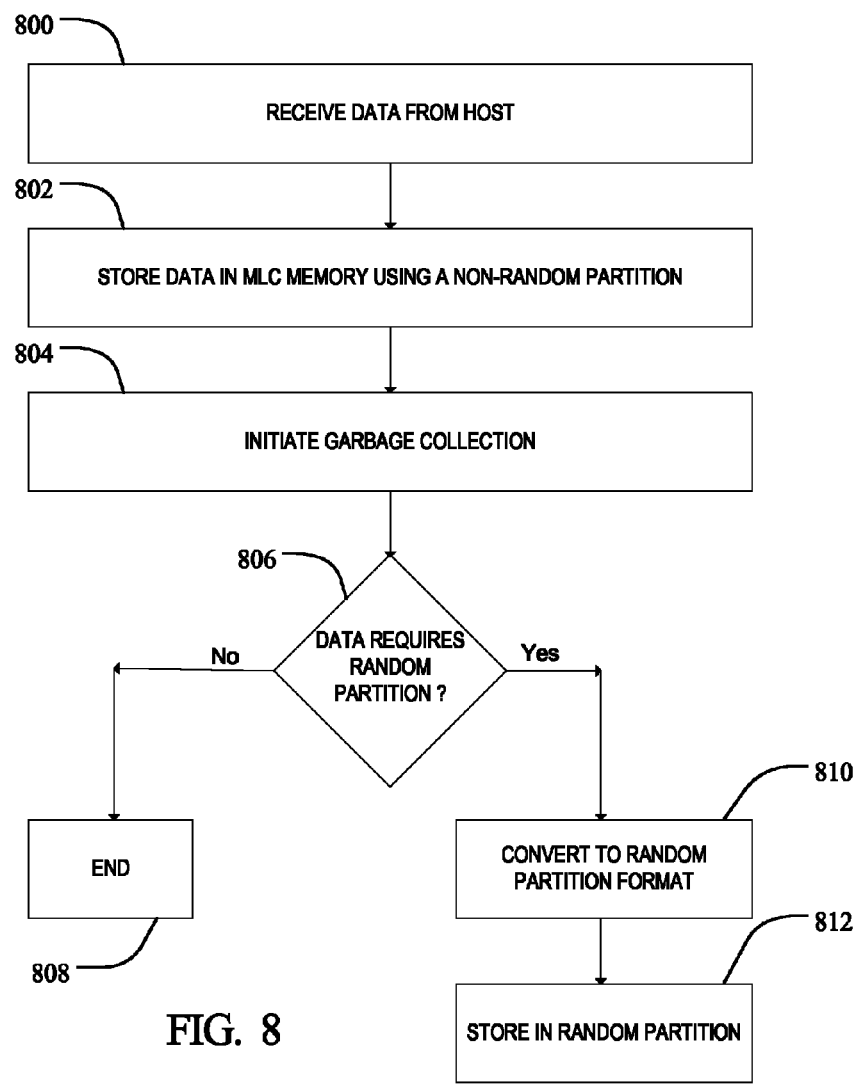
FIG. 8 is a flow chart of an alternative embodiment of the method of FIG. 7.

In the embodiment of FIG. 7, a method is described where data is directed to an appropriate partition upon receipt of the data. Referring to FIG. 8, in another embodiment the received data may instead always be directed initially to a default partition 114 in the MLC long term storage array 112. When data is received from the host 100, the storage device 104 may store data in a default partition 114 that is optimized for non-random data (at 800, 802). This initial storage may be a process where data is written to the cache 110 first and then to the default long term storage partition 114, or where data is written directly to the default partition 114 in the long term memory array 112. Because all data is directed initially to a partition 114 optimized for non-random data, all received data has the ECC high protection level and format for that partition applied to it regardless of whether it is data suited for the non-random partition or a random partition.

In the embodiment of FIG. 8, when a triggering event such as a garbage collection or other memory management operation (such as wear leveling) is later initiated in the long term memory array, data is transferred from the memory array into the controller, where it is analyzed and optimized. The controller 116 of the storage device 104 will then determine the data type of each data section that is being garbage collected. Based on the determination of data type, the controller 116 may decide that the data is better suited for another partition, such as a partition optimized to handle random data. If the data being analyzed during garbage collection does not need to be moved based on the data type or other criteria determined by the controller 116, then that data is left in the default partition (at 806, 808).

If the controller 116 determines that the data being analyzed during memory management or garbage collection time is currently stored in a non-optimized fashion and should be moved to a different partition, such as a partition optimized for random data, then the controller 116 moves that data accordingly. To move the data from the default partition to a different partition, the controller 116 reads that data from the default partition, decodes it using the ECC engine 124, and converts the format of the data from that of the default partition to that of the random partition (at 806, 810), for example by encoding the decoded data with ECC protection format of the random partition. The converted format data is then stored in the random partition (at 812). Although a non-random partition was identified as the default partition, the random partition may be the default partition on other embodiments. Other triggering events are also contemplated. For example, in another embodiment, the triggering event for analyzing whether to transfer data from one partition to another may comprise a set of sequential read operations from the host to a LBA range defined as random access format.

In yet other implementations where multiple partitions are present in the long term memory array 112 of the storage device 104, and where each partition 114 has a different ECC protection level, any one of the partitions may be set as the default partition and data may be moved to another partition during garbage collection or other memory management time in the storage device according to the data optimization parameters associated with the other partitions. It is contemplated that the memory management or garbage collection would be processed, along with any movement of data between partitions in the long term memory, as background operations while no host write or other host command is pending. In other implementations, the movement of data between long term storage array (e.g. MLC) partitions may also take place if the memory management or garbage collection takes place as a foreground operation (e.g. while a host command is pending).

The garbage collection process noted above refers to the process of gathering and consolidating logically related data. Over time, as a result of host data files being re-written and updated, many blocks can end up with a relatively small number of pages containing valid data and remaining pages containing data that is obsolete. In order to be able to efficiently use the data storage capacity of the memory array, logically related data pages of valid data are from time-to-time gathered together from fragments among multiple blocks and consolidated together into a fewer number of blocks. This process, and numerous variations thereof, is commonly termed "garbage collection." During garbage collection, as well as other memory management functions, some or all of the memory may not be accessible for read or write operations. Thus, during garbage collection or system management time many parameters of the data stored in the memory may be analyzed. For example, during a memory management operation some blocks may be declared unreliable and the data stored in these blocks is transferred out of the unreliable blocks and copied into other blocks. This is an opportunity for the controller to analyze data and optimize its code and storage method using the procedures noted herein.

In one embodiment, data that is random data, or at least best suited for storage in a partition of the long term storage array 112 optimized for random access, may include executable files, initialization files and temporary files, such as those having file name extensions of .ini, .exe and .tmp, respectively. In another embodiment, data that is sequential data, or at least data best suited for storage in a partition of the long term memory array optimized for sequential or non-random data, may include text files, digital photographs and videos, such as those having file extensions .doc, .jpeg or .mpeg. The controller 116 may alternatively, or additionally, look to where data is stored to decide that a particular file or group of data LBA's is best stored a particular long term memory array partition 114.

For example, the controller 116 may determine what folder the data is destined to be stored in, so that data destined for certain folders, like a temporary folder or an operating system folder, will be determined to be data that is best routed to the long term memory array partition optimized for random access. The controller 116 may determine the destination folder information from metadata stored together with the data, where different tags may be associated with data of the operating system, with data to be stored for a temporary amount of time, or with ordinary data to be stored indefinitely. In yet other embodiments, the controller 116 may look at prior access patterns of the data to decide whether to keep data in one partition or another in the long term memory array 112. The controller may determine access patterns based on the metadata associated with the stored data. Also, some attributes of the data useful for determining access patterns may be stored in one or more tables or other data structures in the memory, such as the file allocation table (FAT) used in a number of flash memory operating systems.

A method and system has been disclosed for implementing multiple partitions in a long term flash memory array where one partition may be optimized for data suited for random access and another partition may be optimized for data suited for sequential or less than full random access. The decision to format and store data in a particular partition may be made upon receipt so that data is initially directed into the desired partition in long term memory, or all data may be initially formatted and stored in a default partition and later read, reformatted and stored in a different partition. The partitions may be differentiated by different levels of ECC protection, where the random access partition may have a lower level of ECC protection than the sequential partition. The levels of ECC protection may differ by different code word lengths, different ECC algorithms, different code word interleaving schemes, different error floors, any combination of these features, or other variations of ECC protection. The determination of which partition in long term memory that data should be stored in may be made by the local controller in the storage device or by a host processor of a host in communication with the storage device.

In summary, these embodiments can be used to provide a way to optimize data management tasks so as to improve performance in the storage device. Data that is considered random, whether by virtue of being temporary data, data that is read or written in small chunks, data that can readily be reconstructed or re-downloaded online and so on, may be stored in a partition optimized for faster access and lower levels of ECC protection. Data that is considered sequential, such as user files, music or video files, which are generally longer files or files written and read sequentially may be stored in a partition optimized for sequential data where ECC protection is relatively higher than the random partition. More than two partitions, each optimized for a different slice of the sequential or random data and each having differing ECC protection levels (level of ECC protection increasing as the data is considered more sequential), are also contemplated. The two or more partitions are preferably partitions in the long term memory array, rather than a short term SLC array or other cache memory.

Although it may appear that data arriving from the host is arriving in a random fashion, a closer look into the data could reveal that there are actually several separate sequential streams arriving from host simultaneously that, looked at in combination, look random. This same data, however, may be later read where the corresponding LBA's are read in sequential manner. It is contemplated that, in one embodiment, the controller 116 has the ability to detect a combination of sequential streams as they arrive from the host and categorize the corresponding LBA's for each designated sequential data type accordingly. However, in embodiments where such an ability is not present within the controller and the streams are initially stored in a partition optimized for random data, then during read operations the controller may identify that the set of LBA's are read sequentially and can convert and move the data into a sequential partition of the long term memory even if no garbage collection operation has been initiated.

It is intended that the foregoing detailed description be understood as an illustration of selected forms that the invention can take and not as a definition of the invention. It is only the following claims, including all equivalents that are intended to define the scope of this invention. Also, some of the following claims may state that a component is operative to perform a certain function or configured for a certain task. It should be noted that these are not restrictive limitations. It should also be noted that the acts recited in the claims can be performed in any order—not necessarily in the order in which they are recited.

We claim:

1. A method for implementing at least two data partitions in a long term memory array of a flash memory device:
   in a controller of the flash memory device, the controller:
      receiving data from a host;
      determining a data type for the received data; and
      if the data type for the received data is determined to be a first data type:
         applying a first level of error correction code (ECC) protection to the received data; and
         storing the received data having the first level of ECC protection in a first partition of the flash memory;
      if the data type for the received data is determined to be a second data type:
         applying a second level of ECC protection to the received data; and
         storing the received data encoded with the level of ECC protection in a second partition of the flash memory;
      wherein the first data type comprises data optimized for random access and the second data type comprises data optimized for sequential access; and
      wherein applying the first level of ECC protection and storing the received data the first partition comprises encoding the received data with an ECC algorithm and storing the encoded data in the first partition using a non-interleaved page scheme.

2. The method of claim 1, wherein applying the second level of ECC protection and storing the received data the second partition comprises encoding the received data with the ECC algorithm and storing the encoded data in the second partition using an interleaved page scheme.

3. The method of claim 1, wherein the first level of ECC protection comprises a first ECC code word that is shorter than a second ECC code word used in the second partition.

4. The method of claim 1, wherein determining the data type comprises analyzing the data to determine if it belongs to different data streams.

5. The method of claim 4, wherein analyzing the data comprises analyzing the data during read or write host commands.

6. A method for implementing at least two data partitions in a long term memory array of a flash memory device:
   in a controller of the flash memory device, the controller:
      receiving data from a host;
      determining a data type for the received data, wherein determining the data type comprises the controller analyzing a file extension of the received data;
      if the data type for the received data is determined to be a first data type:
         applying a first level of error correction code (ECC) protection to the received data; and
         storing the received data having the first level of ECC protection in a first partition of the flash memory; and
      if the data type for the received data is determined to be a second data type:
         applying a second level of ECC protection to the received data; and storing the received data encoded with the level of ECC protection in a second partition of the flash memory.

7. The method of claim 6, further comprising determining the data type to be the first data type when the file extension for the received data comprises one of .exe, .ini or .tmp.

8. The method of claim 7, further comprising determining the data type to be the second data type when the file extension for the received data is .doc, .jpeg or .mpeg.

9. A method for implementing at least two data partitions in a long term memory array of a flash memory device:
in a controller of the flash memory device, the controller:
receiving data from a host;
determining a data type for the received data;
if the data type for the received data is determined to be a first data type:
applying a first level of error correction code (ECC) protection to the received data; and
storing the received data having the first level of ECC protection in a first partition of the flash memory;
if the data type for the received data is determined to be a second data type:
applying a second level of ECC protection to the received data; and
storing the received data encoded with the level of ECC protection in a second partition of the flash memory; and
wherein determining the data type comprises analyzing a destination folder for the received data, and wherein received data directed to an operating system folder or a temporary folder is determined to be the first data type.

10. A memory device comprising:
a memory having a long term memory array with at least a first partition and a second partition, each of the first partition and second partition comprising data encoded with a different level of error correction code (ECC) protection; and
a controller in communication with the memory, wherein the controller is configured to:
receive data from a host;
determine a data type for the received data;
when the data type of the received data is determined to correspond to a first data type:
encode the received data with a first level of ECC protection; and
store the data encoded with the first level of ECC protection in the first partition;
when the data type of the received data is determined to correspond to a second data type:
encode the received data with a second level of ECC protection; and
store the data encoded with the second level of ECC protection in the second partition;
wherein the first data type comprises random access data; and
wherein the first level of ECC protection comprises a non-interleaved ECC scheme.

11. The memory device of claim 10, wherein the long term memory array comprises flash memory.

12. The memory device of claim 11, wherein the flash memory comprises multi-level cell (MLC) flash memory.

13. The memory device of claim 10, wherein the second data type comprises sequential access data.

14. The memory device of claim 13, wherein the second level of ECC protection comprises an interleaved ECC scheme.

15. A memory device comprising:
a memory having a long term memory array with at least a first partition and a second partition, each of the first partition and second partition comprising data encoded with a different level of error correction code (ECC) protection; and
a controller in communication with the memory, wherein the controller is configured to:
receive data from a host;
determine a data type for the received data, wherein the controller is configured to determine the data type by analyzing a file extension of the received data;
when the data type of the received data is determined to correspond to a first data type:
encode the received data with a first level of ECC protection; and
store the data encoded with the first level of ECC protection in the first partition;
and
when the data type of the received data is determined to correspond to a second data type:
encode the received data with a second level of ECC protection; and
store the data encoded with the second level of ECC protection in the second partition, wherein the controller is configured to determine the data type by analyzing a file extension of the received data.

16. The memory device of claim 15, wherein the controller is configured to determine that the data type is the first data type when the file extension for the received data comprises one of .exe, .ini or .tmp.

17. The memory device of claim 15, wherein the controller is configured to determine that the data type is the second data type when the file extension for the received data comprises one of .doc, .jpeg or .mpeg.

18. A memory device comprising:
a memory having a long term memory array with at least a first partition and a second partition, each of the first partition and second partition comprising data encoded with a different level of error correction code (ECC) protection; and
a controller in communication with the memory, wherein the controller is configured to:
receive data from a host;
determine a data type for the received data;
when the data type of the received data is determined to correspond to a first data type:
encode the received data with a first level of ECC protection; and
store the data encoded with the first level of ECC protection in the first partition;
and
when the data type of the received data is determined to correspond to a second data type:
encode the received data with a second level of ECC protection; and
store the data encoded with the second level of ECC protection in the second partition; and
wherein the controller is configured to determine the data type by analyzing a destination folder for the received data, and wherein received data directed to an operating system folder or a temporary folder is determined to be the first data type.

19. A method for implementing a random access data partition comprising:
in a memory device having a controller in communication with a memory, the controller:

receiving data from a host;

automatically storing the received data in a format suitable to a first partition of the memory in the first partition; and upon occurrence of a triggering event:

determining a data type of data stored in the first partition;

when the data type is determined to correspond to a first data type, leaving the data in the first partition of the memory; and when the data type is determined to correspond to a second data type, converting the data into a format suitable to a second partition and moving the data to the second partition of the memory device.

20. The method of claim 19, wherein the triggering event comprises a garbage collection operation on the data.

21. The method of claim 20, wherein the first data type comprises data optimized for random access.

22. The method of claim 21, wherein determining a data type comprises analyzing at least one of file type information, folder type information regarding a folder in which the data is stored, or an addressing method used by the host for writing the data.

23. The method of claim 19, wherein determining a data type comprises analyzing a history of accessing the data in the memory device.

24. The method of claim 19, wherein converting the data comprises decoding the data according to the format suitable for the first data type and then encoding the data according to a format suitable for the second data type.

25. The method of claim 19, wherein the triggering event comprises a set of sequential read operations from the host to a LBA range defined as random access format.

26. A memory device comprising:

a long term memory array having at least a first partition and a second partition, each of the first partition and second partition configured for data encoded with a different level of error correction code protection; and a controller in communication with the memory, wherein the controller is configured to:

receive data from a host;

automatically encode the received data with a first level of error correction code (ECC) protection and store received data encoded according to the first level of ECC protection in the first partition of the memory; and upon occurrence of a triggering event:

determine a data type of data encoded with the first level of ECC protection and stored in the first partition;

when the data type is determined to correspond to a first data type, leave the data in the first partition of the memory; and when the data type is determined to correspond to a second data type, move the data to the second partition of the memory device and encode the moved data with a second level of ECC protection.

27. The memory device of claim 26, wherein the controller is configured to make the determination based on a history of accessing the data in the memory device.

28. The memory device of claim 26 wherein said controller is configured to move the data by:

converting the data from an interleaved page scheme to a non-interleaved page scheme.

29. The memory device of claim 26 wherein the controller is configured to encode the data with the second level of ECC protection by decoding the data in the first partition with a first ECC code word and encoding the data with a second ECC code word having length shorter than a length of the first ECC code word.

* * * * *